April 27, 1965 W. KELL, JR., ETAL 3,181,034

ENCAPSULATED ELECTRONIC MODULE PACKAGE

Filed Dec. 12, 1960

2 Sheets-Sheet 1

INVENTORS
WILLIAM KELL JR.
BY JAMES O. ESSELSTYN

F. J. Sullivan

ATTORNEY

April 27, 1965 W. KELL, JR., ETAL 3,181,034

ENCAPSULATED ELECTRONIC MODULE PACKAGE

Filed Dec. 12, 1960

2 Sheets-Sheet 2

INVENTOR.
WILLIAM KELL JR.
BY JAMES O. ESSELSTYN

F. R. Sullivan

ATTORNEY

United States Patent Office 3,181,034

Patented Apr. 27, 1965

3,181,034

ENCAPSULATED ELECTRONIC MODULE PACKAGE

William Kell, Jr., Auburndale, and James O. Esselstyn, Waltham, Mass., assignors to Sylvania Electric Products Inc., a corporation of Delaware

Filed Dec. 12, 1960, Ser. No. 75,326
2 Claims. (Cl. 317—100)

This invention relates to electronic packaging techniques and particularly to encapsulated electronic assemblies.

The necessity for building high performance electronic systems within limited space allocations has placed increasing emphasis on equipment modularity and miniaturization. Miniaturized modules have been prepared by potting circuits in an epoxy or other plastic substance, but such assemblies present difficulties in providing adequate reliability and accessibility for replacement of defective circuit elements. Moreover, heat dissipation problems increase significantly as size decreases.

The heat transfer problem has been attacked by using thin sheets of material (e.g. metal foil) with high heat conductivity interleaved in parallel planes throughout the potted package. These sheets are then attached to a cold-plate-type heat exchanger which is attached to a suitable heat sink. This type of package design, however, does not permit replacement of critical circuit elements such as transistors.

Accordingly, a primary object of the present invention is to provide a potted electronic package which is adapted for replacement of critical circuit elements and which allows for heat dissipation to protect against harmful thermal effects within the package.

An additional object is to provide an encapsulated electronic package with improved operational reliability and mechanical support characteristics. A still further object is to provide an improved method of fabricating electronic assemblies.

These and related objects are accomplished in one embodiment of the invention which will be described as featuring a package having a first assembly of circuit elements potted or mounted between printed boards with element leads projecting therefrom. After these leads are interconnected, a second potting of the entire unit is accomplished. Cavities are provided along the sides of these potted units for housing replaceable elements, such as transistors or other critical components. Also, grooves and embossments are provided upon the package surface as a contribution to interlocked stacking and the formation of air passages for cooling purposes.

Other objects, features and modifications will be apparent from the following more detailed description of this illustrative embodiment of the invention and reference to the accompanying drawings, wherein.

The modular circuit stick described herein utilizes standard circuitry and components in a highly flexible manner which permits radical size and weight reduction when contrasted with conventional sandwich or printed board methods. It also increases reliability by effectively shielding the circuitry from mechanical damage and adverse environmental effects. The element stick configuration of the invention is capable of manufacture with average production skills and a minimum special tooling.

Figure 1:
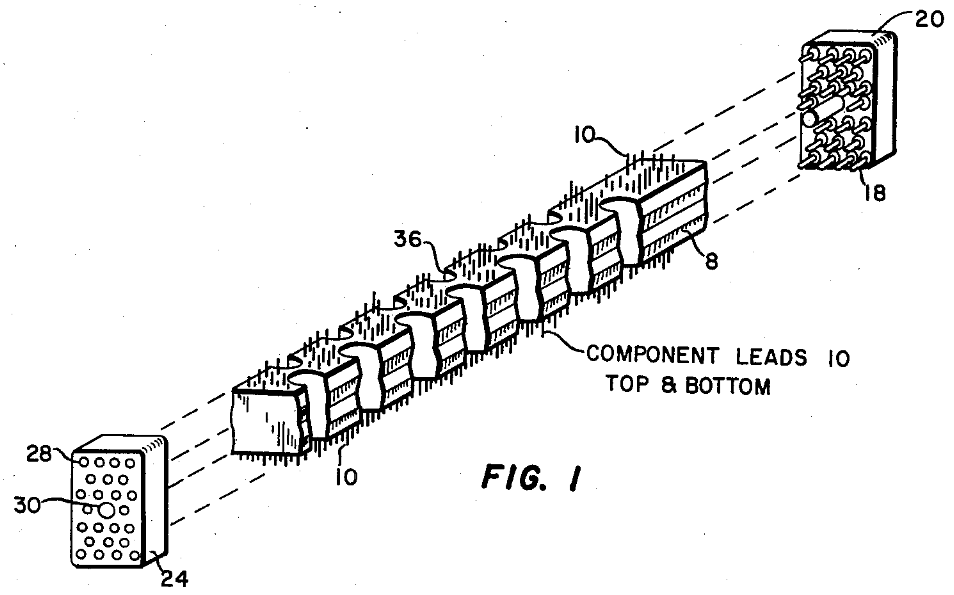
FIG. 1 is a diagrammatic representation of a potted first assembly.
Figure 2:
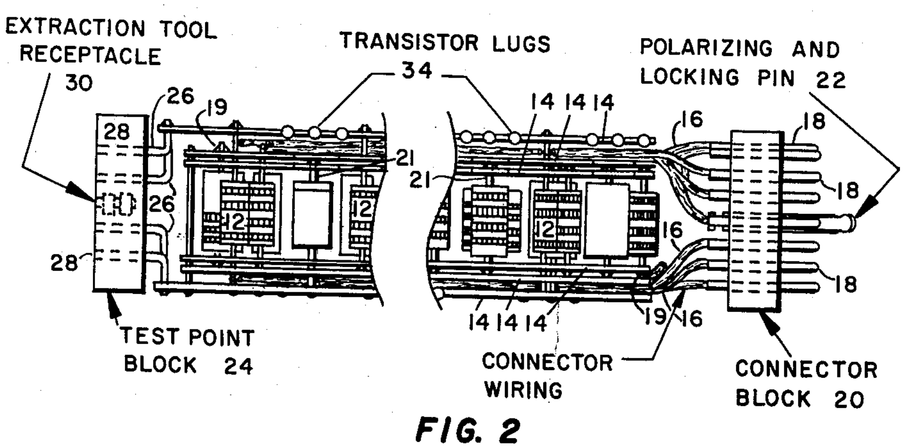
FIG. 2 is a similar representation of an assembled stick in sandwich form prior to encapsulation.

FIG. 1 shows a number of circuit elements embedded in a first assembly 8 of potted plastic with their lead conductors 10 projecting therefrom. FIG. 2 shows another type of first assembly with circuit elements 12 (e.g. resistors) mounted vertically to printed circuit boards 14 which in one embodiment may be .015 inch thick and of glass base epoxy, copper clad. For the circuit interconnection requirements of a given stick, the number of printed circuit boards 14 may be three on top and three on the bottom. Connector wiring 16 is shown lying between the second and third printed boards 14. This point-to-point wiring 16 makes electrical connection between connector pins 18 and the components 12 to which it may be attached via end terminals consisting of partial wrap and solder joints 19 around specific component leads 21.

The connector pins 18 are inserted into a diallyl phthalate connector block 20. These pins may be fabricated from a copper alloy material having gold plating. A polarizing and locking pin 22 is built into the connector block 20 to insure positive mating with a connector receptacle (not shown). In the design shown, the insertion and extraction force between the male connector 18 and its receptacle (not shown) may be between ten and thirty pounds and the nonpluggable ends of the connector pins 18 are standard solder cup terminals.

FIG. 2 also shows a test point block 24 which, similarly, may be molded in diallyl phthalate and has contacts 26 of the same material as the aforementioned male connector pins 18. In the embodiment under description, the test point block 24 has ten sockets 28 suitable for mating with 0.040 inch diameter test probes (not shown). For co-operation with a module extraction tool, an appropriately keyed or threaded insert 30 may be molded into the test point block 24. Contacts 26 of the block are soldered directly to the printed circuit boards 14.

Figure 3:
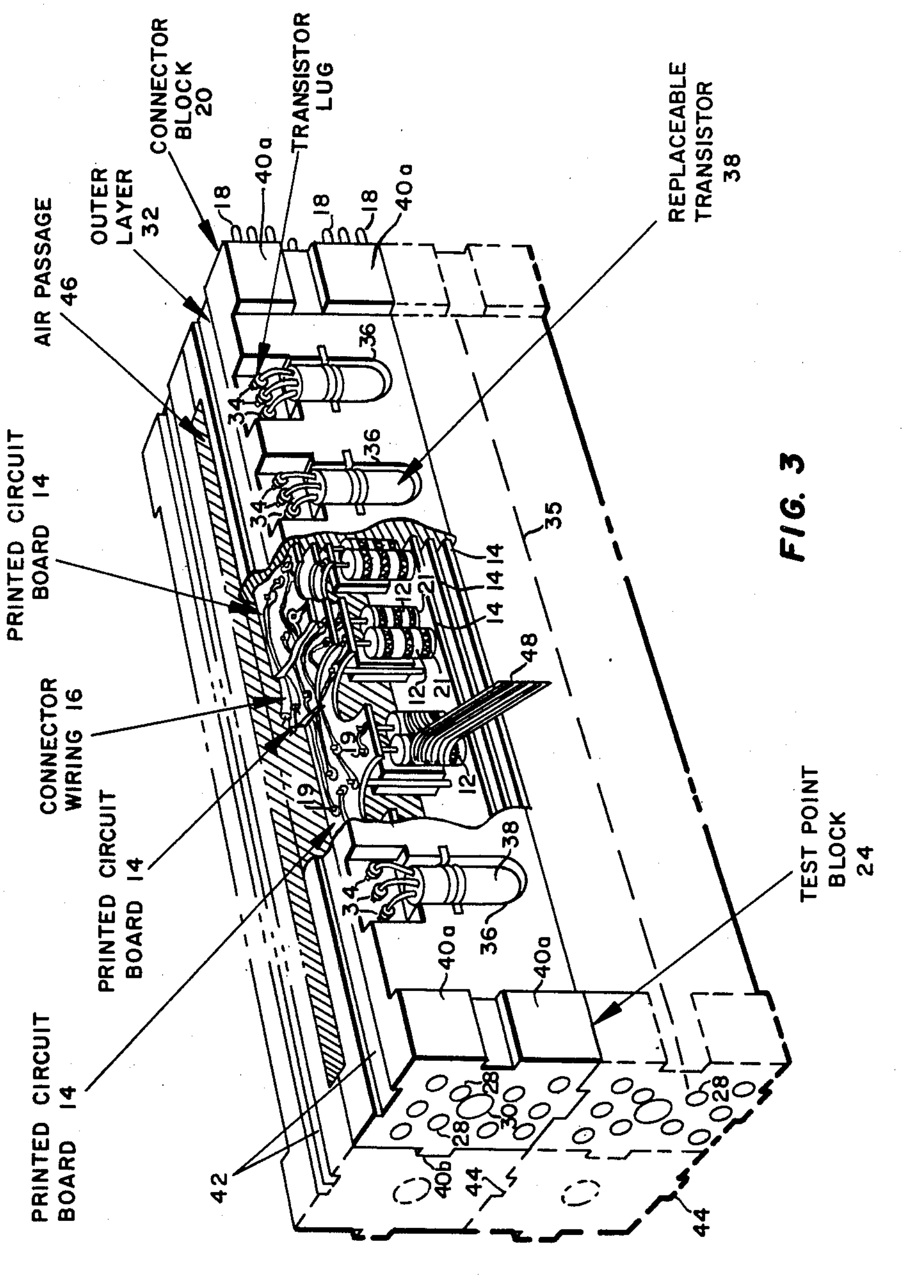
FIG. 3 is a cutaway isometric representation of a stick after encapsulation, and its interassociation with other sticks; and, FIG. 4*a* is a top view of an encapsulated stick with associated end views 4*b* and 4*c*.

FIG. 3 is a cutaway representation of a fully encapsulated stick or module. The outer layer 32 of the encapsulation may be of quartz-filled epoxy and is fixed in dimension to provide for mating with other similar units. Physical spacing of transistor socket lugs 34 is uniform to accommodate standardized lengths of transistor leads. Lugs 34 may be cylindrical and of the solder cup type. Thermocouples 35, e.g. twisted pair conductors of iron or copper and constantan, may be located within the package (see FIG. 3) and connected to one of the test points 28 to monitor plastic and circuit element temperature, etc.

FIGS. 1 and 3 show recesses 36 in the sides of the module to hold critical circuit elements 38 such as transistors or diodes. Protruding embossments 40*a* and 40*b*, slots 42 and embossed guide keys 44 are provided on each stick so that interconnections of groups of sticks are properly aligned and polarized and provide each other with a mutual mechanical support which makes module racks unnecessary. In the combinations shown, protrusions 40*a* and 40*b* at the ends of the sticks combine and interlock to provide a passage 46 for circulating cooling air between sticks. Heat may be dissipated from internal components 12 by means of metal fins 48 extending from contact with the internal components 12 within the package through the plastic and into the air passages 42. These fins may be included at the time of initial fabrication or added by cutting or drilling the plastic and repotting if their need becomes evident during operation.

Figure 4B:
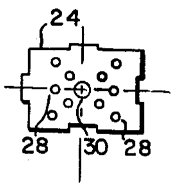
Figure 4A:
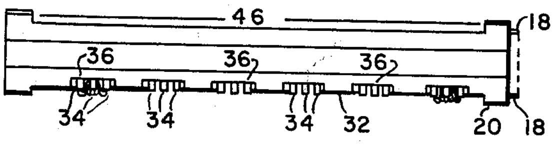
Figure 4C:
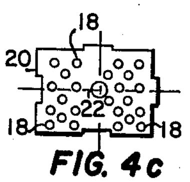

FIGS. 4*a*–*c* show a fully encapsulated stick in top and end view representations, which depict the air passage geometry.

The location of circuit elements 38 in side wall cavities or depressions 36 entering into air passages 46, in addition to the transistor replacement and cooling which it makes possible, also eliminates tight tolerance requirements for the elements to be placed within the cavities. Another feature of this package is that the embossments 40, in addition to their interlocking function, provide buffer surfaces for compression when the sticks are locked into self-supporting bundles. These compression surfaces, being located at the ends of the stick, insure that the circuit elements and their supporting plastic will not be unduly stressed when the bundles of sticks are assembled. In fact, they contribute to what might be considered a plastic I beam structure.

The technique of first and second potting permits the fabrication of standard first assemblies of resistors, capacitors, transistor lugs, etc. in relatively large production runs of the first potting and selective interconnection of these elements preliminary to the second potting. Also, elements can be added or removed after the first potting by simple drilling, chipping and cutting operations followed by repotting. Another advantage of the two-stage potting is that the method of interconnecting wiring employed may be adapted to circumstances of intended use, etc. For example, point-to-point solder, welding, subminiature printed circuits, etc. may be employed as desired.

One modification of the invention has been described with references to specific sizes, materials, and configurations. These demonstrate one illustrative embodiment only, and are not to be taken as limitations on the invention itself, which embraces the full scope of the following claims.

What is claimed is:

1. An electronic circuit assembly comprising at least two parallel spaced apart elongated printed circuit boards, a plurality of electronic components located in parallel relationship and disposed between said printed circuit boards with their leads extending in opposite directions from the ends thereof and joined to the printed circuits on respective ones of said boards, a potting compound encapsulating said electronic assembly and forming an elongated stick of generally rectangular cross section having a first pair of side surfaces substantially parallel to said printed circuit boards and a second pair of side surfaces perpendicular to said first pair of side surfaces, at least one of the side surfaces of said second pair having at least one depression therein oriented in parallel relationship with said components and shaped to receive another circuit component, and another circuit component mounted in each of said depressions with its leads detachably connected to the printed circuit on one of said circuit boards.

2. An electronic circuit package comprising a plurality of stacked interlocking encapsulated electronic circuit sticks, each of said sticks comprising at least two parallel spaced apart elongated printed circuit boards extending along the length of said stick, a plurality of electronic components located in parallel relationship and extending between said printed circuit boards with their leads extending in opposite directions from the ends thereof and joined to the printed circuits on respective ones of said boards, a potting compound encapsulating said printed circuit boards and said components and forming an elongated stick of rectangular cross section throughout a major portion of its length having a first pair of surfaces disposed parallel to said printed circuit boards and having a first transverse dimension and a second pair of surfaces disposed parallel to said components and having a second transverse dimension greater than said first transverse dimension, said stick having end sections at each end of said major portion, said end sections being of like rectangular cross-section and each having a first pair of surfaces constituting extensions of the first pair of surfaces of said major portion and having a transverse dimension greater than said first transverse dimension, and a third pair of surfaces parallel to said components and having a transverse dimension equal to said second transverse dimension, the surfaces of said first pair having a slot and a key formed therein, respectively, co-extensive with said stick and interlocking a key and a slot, respectively, in a first pair of contiguous sticks, and the surfaces of said third pair having formed therein a slot and a key, respectively, each extending along the stick and interlocking a key and a slot, respectively, in the end sections of a second pair of contiguous sticks, thereby to form a conduit for air through the circuit package in a direction parallel to said components, at least one of said second surfaces of each stick having at least one depression formed therein in parallel relationship to said components and shaped to receive another circuit component, and another circuit component mounted in each of said depressions and exposed to cooling air in said conduit with its leads detachably connected to the printed circuit of one of said circuit boards.

References Cited by the Examiner

UNITED STATES PATENTS

| | | | |
|---|---|---|---|
| 1,333,004 | 3/20 | Vaughn | 18—59 |
| 1,709,089 | 4/29 | Nash | 317—101 |
| 2,590,821 | 3/52 | Kiser | 317—101 |
| 2,850,681 | 9/58 | Horton | 317—101 |
| 2,857,558 | 10/58 | Fiske | 317—101 |
| 2,862,992 | 12/58 | Franz | 317—101 |
| 2,911,572 | 11/59 | Francis | 317—101 |
| 2,912,624 | 11/59 | Wagner | 317—101 |
| 2,940,017 | 6/60 | Murphy et al. | 317—101 |
| 2,959,774 | 11/60 | Arrasmith | 317—99 |
| 2,994,806 | 8/61 | McLaughlin | 317—99 |
| 3,013,186 | 12/61 | Jones | 317—101 |
| 3,045,290 | 7/62 | Anderson et al. | 18—59 |
| 3,098,950 | 7/63 | Geshner | 317—101 |

FOREIGN PATENTS

| | | |
|---|---|---|
| 225,239 | 10/59 | Australia. |
| 827,251 | 2/60 | Great Britain. |

OTHER REFERENCES

"High-Density Electronic Packaging-Structural Design" by Courtland B. Converse and Paul N. James, pp. 60–63, Electronic Design for July 19, 1961.

JOHN F. BURNS, *Primary Examiner.*

SAMUEL BERNSTEIN, *Examiner.*